United States Patent
Oren et al.

(10) Patent No.: US 8,514,991 B2
(45) Date of Patent: Aug. 20, 2013

(54) METHOD CIRCUIT AND SYSTEM FOR ADAPTING A RECEIVER RECEIVE CHAIN BASED ON DETECTED BACKGROUND NOISE

(75) Inventors: Roy Oren, Magshimim (IL); Noam Lavi, Yokneam (IL)

(73) Assignee: Siano Mobile Silicon Ltd., Kfar-Netter (IL)

(*) Notice: Subject to any disclaimer, the term of this patent is extended or adjusted under 35 U.S.C. 154(b) by 0 days.

(21) Appl. No.: 13/490,468

(22) Filed: Jun. 7, 2012

(65) Prior Publication Data

US 2012/0243428 A1  Sep. 27, 2012

Related U.S. Application Data

(62) Division of application No. 12/461,752, filed on Aug. 24, 2009.

(51) Int. Cl.
*H04L 27/08* (2006.01)

(52) U.S. Cl.
USPC .......... 375/345; 375/346; 455/136; 455/138; 455/177.1; 455/200.1; 455/219; 455/232.1; 455/233.1; 455/234.1; 455/234.2; 455/240.1; 455/241.1; 455/245.1; 455/245.2; 455/246.1; 455/247.1; 455/250.1; 455/255

(58) Field of Classification Search
CPC ............. H03G 3/3068; H03G 3/3052; H03G 2201/202; H03G 2201/206; H03G 2001/30; H04W 52/52; H04N 5/52

USPC ...... 375/339, 340, 344, 345, 346; 455/232.1, 455/241.1, 245.1, 245.2, 247.1, 250.1, 136, 455/138, 117.1, 200.1, 219, 233.1, 234.1, 455/234.2, 240.1, 255
See application file for complete search history.

(56) References Cited

U.S. PATENT DOCUMENTS

| | | | |
|---|---|---|---|
| 7,424,278 B2* | 9/2008 | Campbell et al. | 455/179.1 |
| 8,009,781 B2* | 8/2011 | Kang et al. | 375/350 |
| 8,041,322 B2* | 10/2011 | Akahori | 455/234.1 |
| 2004/0229561 A1* | 11/2004 | Cowley et al. | 455/3.01 |
| 2006/0094383 A1* | 5/2006 | Zylowski | 455/232.1 |
| 2006/0111066 A1* | 5/2006 | Thorpe | 455/232.1 |
| 2007/0030929 A1* | 2/2007 | Gao et al. | 375/345 |
| 2007/0293177 A1* | 12/2007 | Li | 455/232.1 |

* cited by examiner

*Primary Examiner* — Sophia Vlahos
(74) *Attorney, Agent, or Firm* — Eitan, Mehulal & Sadot

(57) ABSTRACT

Disclosed is a radio frequency (RF) receiver for receiving a communication channel modulated on one or more carrier frequencies. The receiver may include a gain adjustable RF amplifier, a wideband signal power measurement circuit, and control logic. The control logic may be adapted to use outputs of one or more measurement circuits to classify interfering signals based on measured signal power and spectral proximity to the one or more channel carrier frequencies, and to adjust the gain of the radio frequency amplifier based on the classification.

20 Claims, 3 Drawing Sheets

| ALGORITHM OF SPECTRAL CLASSIFICATION AND AMPLIFIER GAIN ADJUSTMENTS | | |
|---|---|---|
| | POWER OF SIGNALS IN THE WIDEBAND SPECTRUM | AMPLIFIER GAIN SETTINGS |
| FUNCTIONALLY NEGLIGIBLE INTERFERENCE | Signal power of desired channel N is significantly greater than signal power of channels from the lower limit of the wideband range to N-1 and the signal power of channels from N+1 to the upper limit of the wideband range | RF AMPLIFIER GAIN IS ADJUSTED (E.G. ALLOWING $3^{RD}$ HARMONICS) SETTING Poob AT LEVEL 1 (E.G. -50 dBm IN DVB-T) - LIMITING FACTOR BEING DESIRED CHANNEL'S POWER |
| NEAR CHANNEL INTERFERENCE | Signal power of any channel from N+1 to N+K or from N-K to N-1 is significantly greater than signal power of desired channel N or total signal power of channels from N-K to N+K (not including channel N) is significantly greater than signal power of desired channel N | RF AMPLIFIER GAIN IS ADJUSTED (E.G. DECREASING $3^{RD}$ HARMONICS) SETTING Poob AT LEVEL 2 (E.G. -25 dBm IN DVB-T) - LIMITING FACTOR BEING INTERFERING CHANNEL'S POWER |
| FAR CHANNEL INTERFERENCE | Signal power of desired channel N is not significantly weaker than signal power than signal power of channels N+1 to N+K and N-K to N-1. Signal power of any channel outside the range of N-K to N+K is significantly greater than signal power of desired channel N or the total power of all channels outside the range of N-K to N+K is significantly greater than signal power of desired channel N | RF AMPLIFIER GAIN IS ADJUSTED (E.G. ALLOWING $3^{RD}$ HARMONICS) SETTING Poob AT LEVEL 3 (E.G. 20 dBm IN DVB-T) AND SETTING Pin-band AT LEVEL 3 (E.G. -36 dBm IN DVB-T) - (MINIMUM GAIN REQUIREMENT SELECTED) LIMITING FACTOR BEING INTERFERING CHANNEL'S POWER |

FIG. 3

METHOD CIRCUIT AND SYSTEM FOR ADAPTING A RECEIVER RECEIVE CHAIN BASED ON DETECTED BACKGROUND NOISE

CONTINUITY AND PRIORITY CLAIMS

The present application is a Divisional Application of U.S. patent application Ser. No. 12/461,752, filed on Aug. 24, 2009, by the inventors of the present application, and the aforementioned application is hereby incorporated into this application by reference in its entirety.

FIELD OF THE INVENTION

The present invention relates generally to the field of communication. More specifically, the present invention relates to a method, circuit and system for adapting a receiver receive chain based on detected background noise.

BACKGROUND

Modern communication networks are characterized by features such as high bandwidth/data-rate, complex communication protocols, various transmissions medium, and various access means. Fiber optic networks span much of the world's surface, acting as long-haul networks for carrying tremendous amounts of data between distant points on the globe. Cable and other wire-based networks supplement coverage provided by fiber optic networks, where fiber networks have not yet been installed, and are still used as part of local area networks ("LAN"), for carrying data between points relatively close to one another. In addition to wire-based networks, wireless networks such as cellular and other wireless networks (e.g. 2G, 3G, CDMA, WCDMA, WiFi, mobile TV, digital TV, etc.) are used to supplement coverage for various devices (e.g. cell phone, wireless IP phone, wireless internet appliance, etc.) not physically connected to a fixed network connection. Wireless networks may act as complete local loop networks and may provide a complete wireless solution, where a communication device in an area may transmit and receive data from another device entirely across the wireless network.

With the proliferation of communication networks and the world's growing reliance upon them, proper performance is crucial. High data rates and stable communication parameters at low power consumption levels are highly desirable for mobile communication devices. However, degradation of signal-to-noise ratio ("SNR") as well as Bit energy to noise ratio ("Eb/No") and interference ratios such as Carrier to-Interference ("C/I") ratio occur to a signal carried along a transmission medium (e.g. coax, unshielded conductor, wave guide, open air or even optical fiber or RF over fiber). This degradation and interferences may occur in TDMA, CSMA, CDMA, EVDO, WCDMA, FDMA and WiFi networks respectively. Signal attenuation and its resulting SNR degradation may limit bandwidth over a transmission medium, especially when the medium is air or open space.

Radio Frequency ("RF") based wireless communication systems ranging from cellular communication systems to satellite radio broadcasting systems are highly prevalent, and their use is consistently growing. Due to the unshielded nature of the transmission medium of wireless RF based communication systems, they are particularly prone to various phenomena, including interference signals or noise and fading signals, which tend to limit performance of such systems.

Thus, strong and stable signals are needed for the proper operation of a wireless communication device. In order to improve the power level of signals being transmitted over relatively long distances, and accordingly to augment the transmission distance and/or data rate, devices may utilize power amplifiers to boost transmission signal strength. In addition to the use of power amplifiers for the transmission of communication signals, receivers may use low noise amplifiers ("LNAs") and variable gain amplifiers ("VGAs") in order to boost and adjust the strength and/or amplitude of a received signal.

An additional problem with wireless RF based transmissions is that they may be characterized by a multipath channel between the transmitter antenna and the receiver antenna which introduces "fading" in the received signal power. The combination of attenuation, noise interference and "fading" is a substantial limitation for wireless network operators, mitigating their ability to provide high data-rate services such as Internet access and video phone services.

Some modern RF receivers may use various techniques and circuits implementing these techniques to compensate for phenomenon resulting from weak signal and interference. For example, the gain settings of the internal amplifiers may be adjusted based on the condition of the RF spectrum in which the receiver operates. Methods for adjusting the gain of internal amplifiers based on signal interference are well known. However, they do not take into account the many variations and permutations of interference that may occur in a wireless communication network.

There exists a need in the field of wireless communications for methods, circuits, devices and systems for enhancing communication signal reception by a wireless receiver.

SUMMARY OF THE INVENTION

The present invention is a method, circuit and system for adapting a receiver receive chain based on detected background noise. According to some embodiments of the present invention, there is provided a circuit and system for wireless data communication along a given radio frequency (RF) carrier frequency or a plurality of carrier frequencies from the set of available carrier frequencies. According to further embodiments of the present invention, communication signals may be transmitted and received along a given channel (i.e. a RF signal with some bandwidth centered at a given carrier frequency or a plurality of carrier frequencies) or a plurality of channels from the set of available channels. According to further embodiments of the present invention, the circuit may include an RF transmitter for wireless data broadcasting.

According to some embodiments of the present invention, the radio portion of the electromagnetic spectrum may be used for transmitting the data from a radio tower. According to some embodiments of the present invention, the microwave portion of the electromagnetic spectrum may be used for transmitting the data from a wireless access point (e.g. a base station). According to further embodiments of the present invention, there is provided an RF receiver that may receive wireless data signals through an antenna and may convert the wireless data signals into a more suitable form by filtering, amplifying and demodulating the signals.

According to some embodiments of the present invention, the receiver may include an RF tuner to perform RF amplification (i.e. amplifying the incoming signal), mixing (i.e. down converting the channel center frequency to baseband), filtering (i.e. removing unwanted signals which are outside the relevant channel) and baseband amplification (i.e. amplifying the baseband signal for analog-to-digital converting).

According to further embodiments of the present invention, channel quality may be improved by varying the RF tuner gain (i.e. the gain of the RF amplification and the gain of the baseband amplification) based on the state of the RF spectrum. According to some embodiments of the present invention, the RF tuner gain may be adjusted based on the power of the noise from other channels and their distance from the given receiving channel.

According to some embodiments of the present invention where the receiver is an essential component of, or functionally associated with a mobile device, RF tuner gain settings may need to be constantly monitored and/or updated as RF spectrum conditions may change rapidly. According to further embodiments of the present invention, the RF tuner may monitor the given channel's power while independently monitoring the signal power of neighboring channels and/or the wideband power. According to some embodiments of the present invention, the given channel's power may be monitored by the RF tuner during the down converting process. According to some embodiments of the present invention when the communication network protocol allots open time slots in between bursts of data transmission, the RF tuner may down convert neighboring channels and measure their power during transmission off-time (e.g. time-division multiplexing). According to some embodiments of the present invention where the signals are interleaved and include sufficient redundancy, the RF tuner may down convert neighboring channels and measure their power without utilizing open time slots. According to further embodiments of the present invention, the RF tuner may include a plurality of amplifiers and mixers for simultaneous down-conversion and power measurement of multiple channels. According to some embodiments of the present invention, the RF tuner may measure the wideband power by calculating the total signal power at the input or the output of the RF amplifier.

According to some embodiments of the present invention, the RF tuner may be programmed with an algorithm for improving channel quality by varying the RF tuner gain based on the power measurements of the channels and the condition of the RF spectrum. According to further embodiments of the present invention, it may be useful to consider three general conditions of the RF spectrum in relation to the given channel, i.e. functionally negligible interference, near interference, and far interference. According to some embodiments of the present invention, functionally negligible interference may be a determination that the given channel's power is not significantly weaker than the total power of all other channels. According to some embodiments of the present invention, near interference may be a determination that at least one available channel, in close proximity to the given channel (i.e. small frequency difference), is transmitting with significantly stronger power than the given channel or that the total power of the channels in close proximity to the given channel is significantly stronger than the given channel power. According to some embodiments of the present invention, far interference may be a determination that at least one available channel, at a significant distance from the given channel (i.e. great frequency difference), is transmitting with significantly stronger power than the given channel or that the total power of the channels at a significant distance from the given channel is significantly stronger than the given channel.

According to some embodiments of the present invention, a functionally negligible interference condition may allow the RF tuner to adjust its gain entirely based on the signal power of the given channel. According to some embodiments of the present invention, interference from near channels may be considered separately from far channels since some harmonics of the far channels which are created due to non-linearities of the RF amplifiers fall outside the desired channel. According to further embodiments of the present invention, the RF tuner may have to use a more sophisticated filter to reduce the effects of near channel interference while optimally adjusting the gain of its amplifiers.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 is an exemplary table according to some embodiments of the present invention displaying a possible algorithm for adjusting amplifier gains based on spectral classification in accordance with the exemplary embodiment of FIG. 1.

Figure 1:
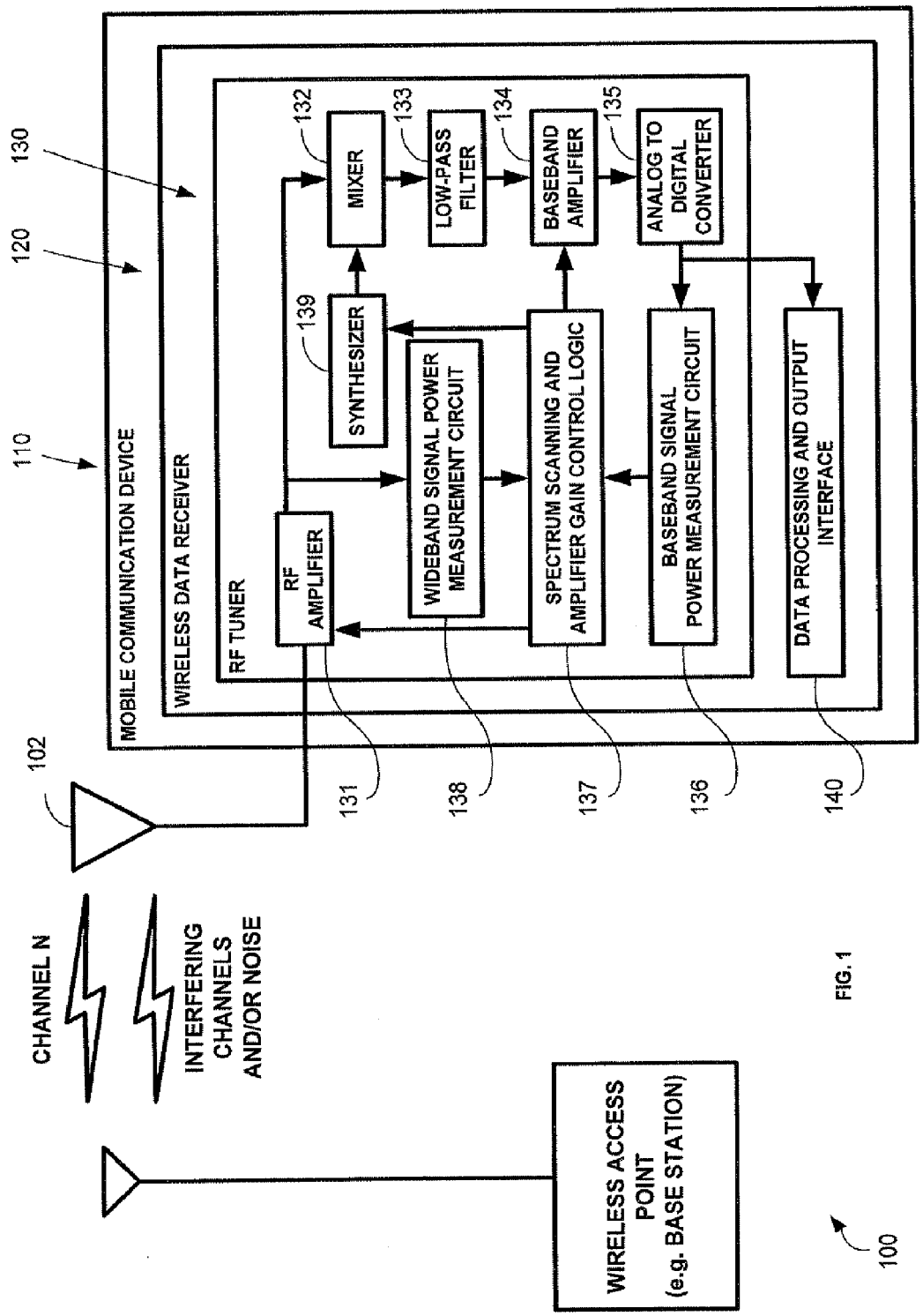
FIG. 1 is a functional block diagram of an exemplary data receiver according to some embodiments of the present invention where the receiver includes a zero-IF tuner.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, DVDs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

It should be understood that some embodiments of the present invention may be used in a variety of applications. Although embodiments of the invention are not limited in this respect, one or more of the methods, devices and/or systems disclosed herein may be used in many applications, e.g., civil applications, military applications or any other suitable application. In some demonstrative embodiments the methods, devices and/or systems disclosed herein may be used in the field of consumer electronics, for example, as part of any suitable television, video Accessories, Digital-Versatile-Disc (DVD), multimedia projectors, Audio and/or Video (A/V) receivers/transmitters, gaming consoles, cellular phones, navigation devices, video cameras, video recorders, and/or automobile A/V accessories. In some demonstrative embodiments the methods, devices and/or systems disclosed herein may be used in the field of Personal Computers (PC), for example, as part of any suitable desktop PC, notebook PC, monitor, and/or PC accessories. In some demonstrative embodiments the methods, devices and/or systems disclosed herein may be used in the field of professional A/V, for example, as part of any suitable camera, video camera, and/or A/V accessories. In some demonstrative embodiments the methods, devices and/or systems disclosed herein may be used in the medical field, for example, as part of any suitable endoscopy device and/or system, medical video monitor, and/or medical accessories. In some demonstrative embodiments the methods, devices and/or systems disclosed herein may be used in the field of security and/or surveillance, for example, as part of any suitable security camera, and/or surveillance equipment. In some demonstrative embodiments the methods, devices and/or systems disclosed herein may be used in the fields of military, defense, digital signage, commercial displays, retail accessories, and/or any other suitable field or application.

Although embodiments of the invention are not limited in this respect, one or more of the methods, devices and/or systems disclosed herein may be used to wirelessly transmit video signals, for example, High-Definition-Television (HDTV) signals, between at least one video source and at least one video destination. In other embodiments, the methods, devices and/or systems disclosed herein may be used to transmit, in addition to or instead of the video signals, any other suitable signals, for example, any suitable multimedia signals, e.g., audio signals, between any suitable multimedia source and/or destination.

Although some demonstrative embodiments are described herein with relation to wireless communication including video information, embodiments of the invention are not limited in this respect and some embodiments may be implemented to perform wireless communication of any other suitable information, for example, multimedia information, e.g., audio information, in addition to or instead of the video information. Some embodiments may include, for example, a method, device and/or system of performing wireless communication of A/V information, e.g., including audio and/or video information. Accordingly, one or more of the devices, systems and/or methods described herein with relation to video information may be adapted to perform wireless communication of A/V information.

According to some embodiments of the present invention there is provided a radio frequency (RF) receiver for receiving a communication channel modulated on one or more carrier frequencies comprising a gain adjustable RF amplifier, a wideband signal power measurement circuit, a baseband signal power measurement circuit, and control logic.

According to some embodiments of the present invention, the gain adjustable RF amplifier may be adapted to amplify signals within a band of frequencies which includes one or more carrier frequencies. According to further embodiments of the present invention, the wideband signal power measurement circuit may be adapted to characterize signal strength of signals and/or noise signals in a spectral band corresponding with the band of frequencies amplified by the amplifier and the baseband signal power measurement circuit may be adapted to measure power of a filtered baseband (i.e. down-converted) version of the received signal. According to some embodiments of the present invention, the control logic may be adapted to use outputs of the wideband and baseband measurement circuits to classify interfering signals based on measured signal power and spectral proximity to the one or more channel carrier frequencies. According to further embodiments of the present invention, the control logic may be further adapted to adjust the gain of the radio frequency amplifier based on the classification.

According to some embodiments of the present invention, the wideband signal power measurement circuit may measure a collective signal power of the given channel combined with other signals and/or noise in a spectral band around the given channel and may output a parameter corresponding to the measured signal power. According to further embodiments of the present invention, the parameter corresponding to the measured signal power may be input to the control logic as a metric of far channel interference.

According to some embodiments of the present invention, the receiver may be adapted to down convert and amplify one or more channels in spectral proximity with the given channel (i.e. neighboring channels) in addition to the given channel. According to further embodiments of the present invention, neighboring channels may be the range of channels at a distance of four or fewer channel bands from the given channel. According to further embodiments of the present invention, the baseband signal power measurement circuit may determine a parameter corresponding to the measured signal power of the given channel and a parameter corresponding to the measured signal power of neighboring channels. According to further embodiments of the present invention, the parameter corresponding to the measured signal power of the given channel may be input to the control logic as a metric of the given channel's signal strength. According to further embodiments of the present invention, the parameter corresponding to the measured signal power of neighboring channels may be input to the control logic as a metric of near channel interference with the given channel.

According to some embodiments of the present invention when the communication network protocol allots open time slots in between bursts of the signal centered at a given channel, the receiver may down convert and measure the power of neighboring channels (i.e. to measure their power during data transmission off-time). According to some embodiments of the present invention where the signals contain redundant data (e.g. for error-correction and possibly interleaving), the receiver may down convert and measure the power of neighboring channels during bursts of the signal centered at a given channel (i.e. measure their power during data transmission without losing data from the given channel).

According to some embodiments of the present invention, the control logic may be adapted to classify interfering signals and/or channels in proximity to the given channel as one of a plurality of preset conditions. According to further embodiments of the present invention, the preset conditions may be functionally negligible interference, near channel interference and far channel interference.

According to some embodiments of the present invention, interfering signals and/or channels in proximity to the given channel may be classified as functionally negligible interference when the given channel signal strength is stronger or not significantly weaker than near channel interference and stronger or not significantly weaker than far channel interference (i.e. the total power of any signals and/or noise in the received spectrum). According to further embodiments of the present invention, the gain of the RF amplifier may be adjusted in proportion to the given channel signal strength.

According to some embodiments of the present invention, interfering signals and/or channels in proximity to the given channel may be classified as near interference when near channel interference is significantly stronger than given channel signal strength (i.e. the power of at least one neighboring channel or the total power of all neighboring channels is significantly stronger than the power of the given channel). According to further embodiments of the present invention, the gain of the RF amplifier may be adjusted until distortion due to non-linearity (e.g. $3^{rd}$ or higher order harmonics) becomes functionally negligible.

According to some embodiments of the present invention interfering signals and/or channels in proximity to the given channel may be classified as far channel interference when given channel signal strength is stronger or not significantly weaker than near channel interference and significantly weaker than far channel interference. According to further embodiments of the present invention, the gain of the RF amplifier is adjusted allowing some distortion.

According to some embodiments of the present invention there is provided a radio frequency (RF) receiver for receiving a communication channel modulated on one or more carrier frequencies comprising a gain adjustable RF amplifier, a wideband signal power measurement circuit, a frequency adjustable synthesizer, a baseband signal power measurement circuit, and spectrum scanning control logic.

According to some embodiments of the present invention, the gain adjustable RF amplifier may be adapted to amplify signals within a band of frequencies which includes the one or more carrier frequencies. According to further embodiments of the present invention, the frequency adjustable synthesizer may be adapted to generate a mixing signal for down-converting the received signal. According to further embodiments of the present invention, the wideband signal power measurement circuit may be adapted to characterize signal strength of signals and/or noise signals in a spectral band corresponding with the band of frequencies amplified by the amplifier and the baseband signal power measurement circuit may be adapted to measure power of the filtered baseband (i.e. down-converted) version of the received signal. According to some embodiments of the present invention, the spectrum scanning control logic may be adapted to adjust the frequency of the synthesizer (i.e. select which channel to down-convert) and to adjust the gain of the RF amplifier in response to an output from the power measurement circuits.

According to some embodiments of the present invention, the spectrum scanning control logic may adjust the frequency of the synthesizer to enable down-conversion of the given channel in addition to one or more channels in spectral proximity to the given channel. According to further embodiments of the present invention, one or more channels in spectral proximity to the given channel may be down-converted in between bursts of the signals within a band of frequencies which includes the one or more carrier frequencies. According to further embodiments of the present invention, one or more channels in spectral proximity to the given channel may be down-converted during bursts of the signals within a band of frequencies which includes the one or more carrier frequencies when the signals contain redundant data.

Figure 2:
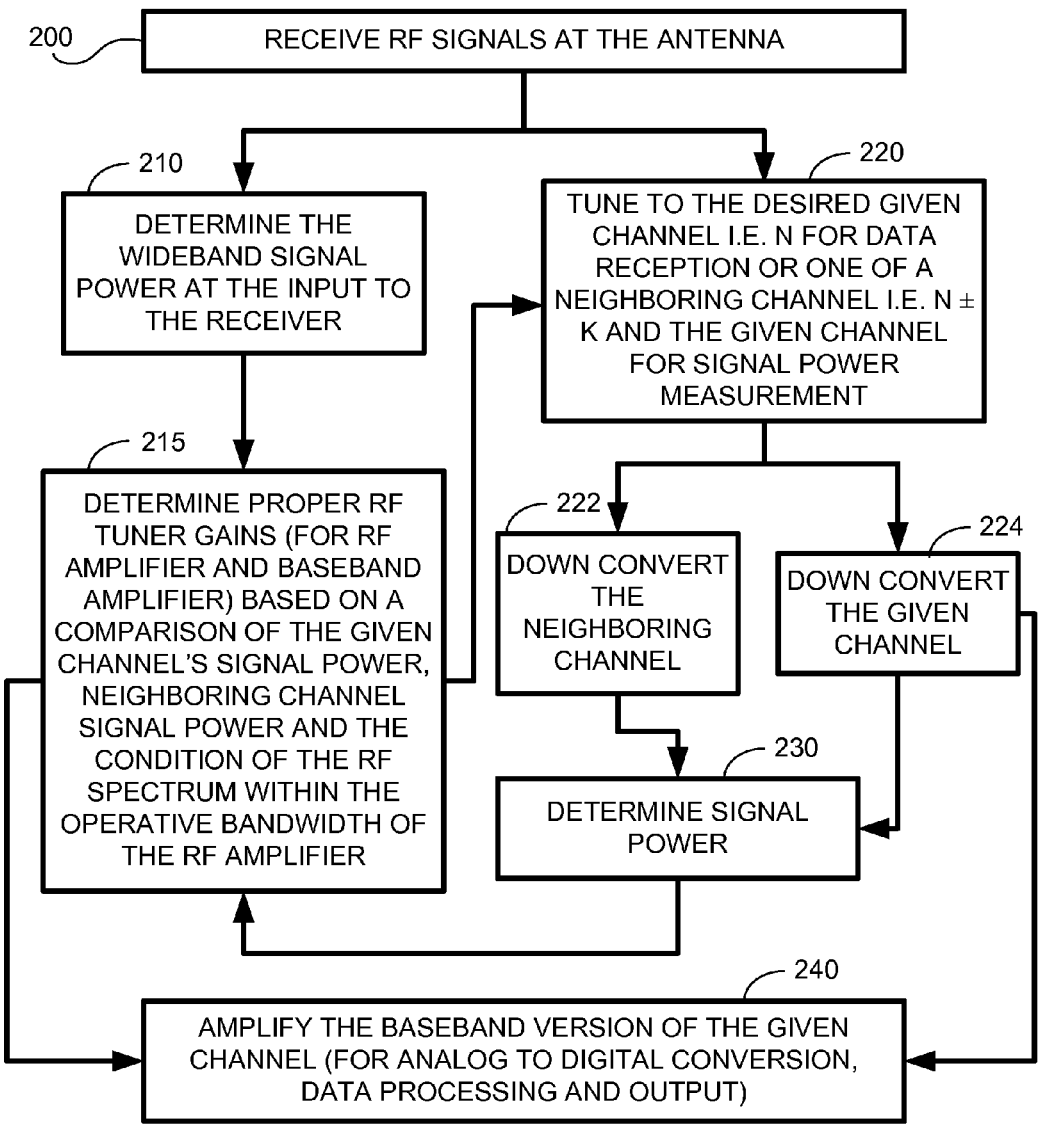
FIG. 2 is a flowchart including the steps of a method of determining the given carrier frequency power and detected background noise in accordance with the exemplary embodiment of FIG. 1.

Turning now to FIG. 1, there is shown an exemplary data receiver according to some embodiments of the present invention. The operation of the receiver may be described in view of FIG. 2 showing a flow chart including the steps of an exemplary method by which the receiver determines the relationship of the given channel power to detected background noise.

According to some embodiments of the present invention, there may be a circuit and system (100) for wireless communication between a base station and a mobile communication device (110) along a given channel. According to further embodiments of the present invention, the mobile communication device (110) may include a wireless data receiver (120) and functionally associated data processing and output interface (140). According to further embodiments of the present invention, the wireless data receiver may include an RF tuner (130) to perform RF amplification (i.e. amplifying the incoming signal), mixing (i.e. down converting the channel center frequency to baseband), low-pass filtering and baseband amplification (i.e. amplifying the baseband signal for analog-to-digital conversion) as well as an analog to digital converter (135).

According to some embodiments of the present invention, the RF tuner may contain a wideband signal power measurement circuit (138) to determine (210) wideband signal power at the output of the RF tuner. According to further embodiments of the present invention, the wideband signal range or width scanned may correspond with an operative bandwidth of the RF amplifier. According to further embodiments of the present invention, one or more parameters relating to the wideband signal power may be calculated or estimated and used by control logic (137). The control logic may use the one or more parameters as a metric of far channel interference.

According to some embodiments of the present invention, the RF tuner may contain a RF amplifier (131) to amplify a signal received (200) at a functionally associated antenna. According to further embodiments of the present invention, the control logic (137) may tune (220) a synthesizer (139) to a mixing frequency required for the down-conversion of a desired given channel (i.e. N) for data reception and signal power measurement or a neighboring channel (i.e. N±K, where K in an integer greater than or equal to 1) for signal power measurement.

According to some embodiments of the present invention, the RF tuner may contain a mixer (132) to down convert (222,224) the signal amplified by the RF amplifier (131). According to further embodiments of the present invention, the RF tuner may contain a low-pass filter (133) to focus the baseband amplification on a desired channel and a baseband amplifier (134) to perform the amplification.

According to some embodiments of the present invention, the RF tuner may contain a baseband signal power measurement circuit (136) adapted to determine (230) the power of the down-converted channel and input the data to the control logic (137) as a metric of near channel interference and/or a metric of given channel power.

According to some embodiments of the present invention, the RF tuner may contain a baseband amplifier (134) to amplify (240) the baseband version of the given channel for a functionally associated analog to digital converter (135) and for a functionally associated data processing and output interface (140).

According to some embodiments of the present invention, the RF tuner may contain control logic (137) to determine and set the ideal gain settings for the RF amplifier (131) and baseband amplifier (134) based on a comparison (215) of the given channel's signal power, the signal power of neighboring channels, and the condition of the RF spectrum within the operative bandwidth of the RF amplifier.

Turning now to FIG. 3, there is shown an exemplary table according to some embodiments of the present invention displaying a possible algorithm for adjusting amplifier gains based on spectral classification.

According to some embodiments of the present invention, the RF spectrum within the operative bandwidth of the RF amplifier (i.e. the wideband spectrum) may be classified as functionally negligible interference when the signal power of the desired channel N is stronger or not significantly weaker than the total signal power of all other channels in the wideband spectrum. According to further embodiments of the present invention, the RF amplifier gain may be adjusted to set Poob (Out Of Band Power—the total power at the RF amplifier output) at level 1. According to further embodiments of the present invention, the limiting factor may be the power of the desired channel N since the desired channel is the biggest contributor to distortion due to non-linearity (e.g. $3^{rd}$ harmonics).

According to some embodiments of the present invention, the RF spectrum within the operative bandwidth of the RF amplifier (i.e. the wideband spectrum) may be classified as near interference when the signal power of any channel from N+1 to N+K is significantly stronger than the signal power of desired channel N or if the signal power of any channel from N−K to N−1 is significantly stronger than the signal power of desired channel N or if the total power of channels N−K to N+K is significantly stronger than the power of channel N (where K is an integer greater than 1). According to further embodiments of the present invention, the RF amplifier gain may be adjusted to set Poob at level 2 decreasing distortion due to non-linearity such as $3^{rd}$ harmonics, which would be detrimental to signal quality. According to further embodiments of the present invention, the limiting factor may be the power of the interfering channel's power.

According to some embodiments of the present invention, the RF spectrum within the operative bandwidth of the RF amplifier (i.e. the wideband spectrum) may be classified as far interference when the signal power of desired channel N is stronger or not significantly weaker than the signal power of all near channels (N+1 to N+K and N−K to N−1) but significantly weaker than any of the far channels (from the upper limit of the wideband range to N+K+1 or from the lower limit of the wideband range to N−K−1). According to further embodiments of the present invention, the RF amplifier gain may be adjusted to set Poob at level 3 and Pin-band (In band power—the power of the desired channel) at level 3 (whichever setting requires a minimum gain setting in the RF amplifier). According to further embodiments of the present invention, the baseband amplifier may be subsequently adjusted, the limiting factor being the power of the interfering channel or the total power of all the channels; since the lower order harmonics of far channels don't interfere with given channel N, the limiting factor can be higher than a case of near interference.

According to some embodiments of the present invention, power level settings may differ across different standards according to the required SNR for clear reception and bandwidth, the RF tuner in use or any filters in use, or any other reasonable consideration. According to some embodiments of the present invention when using the DVB-T standard, Poob 1 may be −50 dBm, Poob2 may be −25 dBm, Poob3 may be 20 dBm and Pin-band3 may be −36 dBm.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid state memory, magnetic tape, a removable computer diskette, a random access memory (RAM), a read-only memory (ROM), a rigid magnetic disk, and an optical disk. Some demonstrative examples of optical disks include compact disk-read only memory (CD-ROM), compact disk-read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A receiver for receiving a communication channel modulated on one or more carrier frequencies, said receiver comprising:
   a gain adjustable radio frequency amplifier coupled to an antenna and adapted to amplify signals within a band of frequencies which includes the one or more carrier frequencies;
   a wideband signal power measurement circuit adapted to characterize signal strength of signals having frequencies in spectral proximity to the one or more carrier frequencies; a frequency adjustable synthesizer adapted to generate a mixing signal for down-converting a received signal including the communication channel;
   a baseband signal power measurement circuit adapted to measure power of a filtered baseband version of the received signal and to perform baseband signal measurements of channels in spectral proximity to the one or more carrier frequencies; and
   spectrum scanning control logic adapted to adjust the frequency of said synthesizer and adapted to adjust the gain of said radio frequency amplifier both adjustments being based on:
   (1) an output from said wideband signal power measurement circuit relating to frequencies in spectral proximity to the one or more carrier frequencies;
   (2) an output from said baseband signal power measurement circuit relating to a filtered baseband version of the received signal, and
   (3) an output from said baseband signal power measurement circuit relating the baseband signal measurements of channels in spectral proximity to the one or more carrier frequencies.

2. The receiver according to claim 1, wherein said spectrum scanning control logic is further adapted to enable down-conversion of channels in spectral proximity with a given channel in addition to the given channel by adjusting the frequency of said synthesizer.

3. The receiver according to claim 2, wherein said spectrum scanning control logic is further adapted to enable down-conversion of channels in spectral proximity with the given channel in between bursts of signals within a band of frequencies which includes the one or more carrier frequencies.

4. The receiver according to claim 2, wherein said spectrum scanning control logic is further adapted to enable down-conversion of channels in spectral proximity with the given channel during bursts of signals within a band of frequencies which includes the one or more carrier frequencies when the signals contain redundant data.

5. The receiver according to claim 2, wherein said wideband signal power measurement circuit is adapted to measure a collective signal power of the channels in spectral proximity with the given channel in addition to the given channel and to output a parameter corresponding to the measured signal power.

6. The receiver according to claim 5, wherein the parameter corresponding to the measured signal power is input to said control logic as a metric of far channel interference.

7. The receiver according to claim 3, further adapted to down convert and amplify the channels in spectral proximity with the given channel in addition to down converting the given channel.

8. The receiver according to claim 7, wherein said baseband signal power measurement circuit determines a parameter corresponding to the measured signal power of the channels in spectral proximity with the given channel in addition to a parameter corresponding to the measured signal power of the given channel.

9. The receiver according to claim 8, wherein the parameter corresponding to the measured signal power of the given channel is input to said control logic as a metric of given channel signal strength.

10. The receiver according to claim 9, wherein the parameter corresponding to the measured signal power of the channels in spectral proximity with the given channel is input to said control logic as a metric of near channel interference.

11. The receiver according to claim 10, wherein said control logic is further adapted to choose a classification from a plurality of preset classifications.

12. The receiver according to claim 11, wherein said control logic is further adapted to classify interfering signals as functionally negligible interference when given channel signal strength is stronger or not significantly weaker than near channel interference and stronger or not significantly weaker than far channel interference.

13. The receiver according to claim 12, wherein said control logic is further adapted to adjust the gain of said radio frequency amplifier in proportion to the given channel signal strength.

14. The receiver according to claim 11, wherein said control logic is further adapted to classify the interfering signals as near channel interference when near channel interference is significantly stronger than given channel signal strength.

15. The receiver according to claim 14, wherein said control logic is further adapted to adjust the gain of said radio frequency amplifier until distortion due to non-linearity becomes functionally negligible.

16. The receiver according to claim 11, wherein said control logic is further adapted to classify the interfering signals as far channel interference when given channel signal strength is stronger or not significantly weaker than near channel interference and significantly weaker than far channel interference.

17. The receiver according to claim 16, wherein said control logic is further adapted to adjust the gain of said radio frequency amplifier allowing some distortion.

18. The receiver according to claim 8, further adapted to down convert and measure the power of the channels in spectral proximity with the given channel in between bursts of a signal centered at a given channel.

19. The receiver according to claim 7, wherein said channels in spectral proximity with the given channel are the channels within a four channel range from said given channel.

20. The receiver according to claim 4, further adapted to be functionally associated with a mobile device.

* * * * *